United States Patent [19]

Kiyonari et al.

[11] Patent Number: 5,063,137
[45] Date of Patent: Nov. 5, 1991

[54] LASER-MARKING METHOD AND RESIN COMPOSITION FOR LASER-MARKING

[75] Inventors: Toshiyuki Kiyonari, Urawa; Satoshi Hirabayashi, Ohmiya; Naoto Kidokoro, Ageo; Futoshi Takimoto, Kawanishi, all of Japan

[73] Assignee: Dainippon Ink and Chemicals, Inc., Tokyo, Japan

[21] Appl. No.: 433,996

[22] Filed: Nov. 9, 1989

[51] Int. Cl.$^5$ .................. G03C 5/00; C08K 3/38
[52] U.S. Cl. .................. 430/292; 430/269; 430/311; 430/945; 522/81; 522/82; 522/83; 524/405; 524/417; 524/424
[58] Field of Search ............ 430/269, 292, 945, 311; 522/81, 82, 83; 524/405, 417, 424

[56] References Cited

U.S. PATENT DOCUMENTS 3,527,730  9/1970  Coulson et al. ............ 524/405
4,791,153  12/1986  Yamanaka .................. 523/453

FOREIGN PATENT DOCUMENTS 166488  8/1985  Japan .

*Primary Examiner*—Marion E. McCamish
*Assistant Examiner*—Mark A. Chapman
*Attorney, Agent, or Firm*—Sherman and Shalloway

[57] ABSTRACT

A resin composition for laser-marking which comprises at least one inorganic compound selected from the group consisting of anhydrous metal borate salt, an anhydrous metal phosphate salt, a phosphoric acid-containing glass, basic zinc carbonate and basic magnesium carbonate, and a resin; and a method for laser-marking the surface of an object composed of the said resin composition by applying laser beams onto the surface.

12 Claims, No Drawings

LASER-MARKING METHOD AND RESIN COMPOSITION FOR LASER-MARKING

This invention relates to a laser-marking method wherein a white marking is made on the surface of an object using laser beams, and a resin composition which gives an object suitable for making a marking by this method and excellent in transparency.

Heretofore, marking by letters or symbols or the like onto the surface of electric and electronic parts such as semiconductors, resistors, condensers, relays and switches and various electric articles has been made by printing using a thermosetting or ultraviolet ray-curable marking ink. However, this method has the problems such as difficulty of marking onto minute objects and complication of the maintenance and control of printing quality. Further, a laser-marking method has been carried out wherein the surface of an object is directly irradiated with laser beams to disappear a part of the surface by the resulting evaporation or thermal decomposition. However, there are various materials of objects to be marked, and this method has the drawback that a distinct marking cannot be made in some materials.

As a method for obviating this drawback, there is for example, a method wherein a white marking is made by applying laser beams onto a molded article or coat prepared from a material for laser-marking containing a metal hydroxide such us aluminum hydroxide and/or a hydrous metal compound such as hydrous zinc borate, and a colorant (Japanese Laid-Open Patent Publication No. 166488/1985).

However, this method has the drawback that since a material for laser-making containing a colorant is used, it is impossible to make the non-irradiated area by laser beam noncolored and transparent.

The present inventors have vigorously studied taking such states into account, and have found that a white marking having a high visibility can be obtained wherein the non-irradiated area by laser beams is transparent and the coloring property of the irradiated area by laser beams is good.

Thus, according to the present invention, we provided a method for laser-marking which comprises marking the surface of an object composed of a resin composition containing at least one inorganic compound selected from the group consisting of an anhydrous metal borate salt, an anhydrous metal phosphate salt, a phosphoric acid-containing glass, basic zinc carbonate and basic magnesium carbonate, and a resin by applying laser beams onto the surface, and a resin composition for laser-marking which comprises at least one inorganic compound selected from the group consisting of an anhydrous metal borate salt, an anhydrous metal phosphate salt, a phosphoric acid-containing glass, basic zinc carbonate and basic magnesium carbonate, and a resin.

Examples of the anhydrous metal borate salt include, for example, anhydrous zinc borate, anhydrous aluminum borate, anhydrous magnesium borate, anhydrous lithium borate, anhydrous sodium borate, anhydrous calcium borate, anhydrous potassium borate, anhydrous barium borate, a boric anhydride series glass, anhydrous potassium metaborate, anhydrous sodium metaborate, anhydrous barium metaborate, anhydrous lithium metaborate, anhydrous calcium metaborate, etc.

Further, Examples of the anhydrous metal phosphate salt to be used in the invention include, for example, anhydrous zinc phosphate, anhydrous aluminum phosphate, anhydrous monomanganese phosphate, anhydrous dimanganese phosphate, anhydrous trimanganese phosphate, anhydrous monomagnesium phosphate, anhydrous dimagnesium phosphate, anhydrous trimagnesium phosphate, anhydrous ferric phosphate, anhydrous titanium phosphate, anhydrous monosodium phosphate, anhydrous disodium phosphate, anhydrous trisodium phosphate, anhydrous monocalcium phosphate, anhydrous dicalcium phosphate, anhydrous tricalcium phosphate, anhydrous zirconium phosphate, anhydrous strontium phosphate, anhydrous monopotassium phosphate, anhydrous dipotassium phosphate, anhydrous tripotassium phosphate, anhydrous cadmium phosphate, anhydrous monobarium phosphate, anhydrous dibarium phosphate, anhydrous tribarium phosphate, anhydrous lithium phosphate, anhydrous monoammonium phosphate, anhydrous diammonium phosphate, anhydrous triammonium phosphate, anhydrous aluminum metaphosphate, anhydrous potassium metaphosphate, anhydrous sodium metaphosphate, anhydrous lithium metaphosphate, anhydrous lead metaphosphate, anhydrous barium metaphosphate, anhydrous calcium metaphosphate, anhydrous tin metaphosphate, etc.

Among hydrous metal phosphate salts, anhydrous metal phosphate salts, phosphoric acid-containing glasses, basic zinc carbonate and basic magnesium carbonate, anhydrous zinc borate, anhydrous aluminum borate, anhydrous lithium borate, anhydrous calcium borate, anhydrous aluminum phosphate, phosphoric acid-containing glasses, basic zinc carbonate and basic magnesium carbonate are preferred in the point that resin compositions for laser-marking excellent in transparency and coloring property can be obtained, and among then anhydrous lithium borate, anhydrous calcium phosphate, phosphoric acid-containing glasses and basic magnesium carbonate are particularly preferred in the point that resin compositions for laser-marking particularly excellent in transparency and coloring property. As the phosphoric acid-containing glasses are preferred those having a phosphoric acid content of 15 wt. % or more, particularly 20 to 85 wt. %.

There may be mentioned as the resin composition for laser-marking of the invention, for example, a molding material, a composition for coating or the like each containing at least one of the above inorganic compounds and a resin. There may be mentioned as an object composed of the resin composition, for example, a molded article prepared by molding the molding material, a coat obtained by applying the composition for coating and then drying or curing it, or the like.

The content of the above inorganic compound in the resin composition for laser-marking is a range such that the content of the inorganic compound in the object composed of the resin composition for laser-marking becomes 5 to 80 wt. %. A range such that the content becomes 10 to 50 wt. % is particularly preferred because the resulting object is excellent in coloring property and transparency and moreover the physical properties of the object is lowered in only a small extent.

When the resin composition for laser-marking of the invention is used as a molding material, any resin having transparency may be used as the resin contained in the molding material. Such a resin may, for example, be a thermoplastic resin or a thermosetting resin capable of extrusion molding, transfer molding, injection molding, blow molding, cast molding, press molding, tape molding or the like. Examples of the thermoplastic resin include polyolefinic resins, vinyl chloride type resins, polystyrenic resins, acrylic resins, polyvinyl alcohol type resins, polyester type resins, polycarbonate type resins, polyamide type resins and the like. Examples of the thermosetting resins include epoxy type resins, phenolic resins, amino resins, polyester type resins, acrylic resins, diallyl phthalate type resins, urethanic resins, furan type resins, silicone type resins and the like. These thermoplastic resins and thermosetting resins may be used alone on as a mixture of two or more of them in a range such that transparency is not spoiled, and those having a refractive index after curing of 1.45 to 1.60 are preferred in the point that moldings having an excellent transparency can be obtained.

When the resin composition for laser-marking is used as a composition for coating, any resin having transparency may be used as the resin in the composition for coating. Such a resin may, for example, be a resin for a normal temperature drying and curing type coating agent, a resin for a moisture curing type coating agent, a resin for a thermosetting coating agent or the like, each of these resins is capable of brush coating, spray coating, dip coating, gravure coating, doctor coating, roll coating, electrostatic coating, powder coating, transparency, printing or the like. Examples of these resins include oil varnish, boiled oil, shellac, cellulosic resins, phenolic resins, alkyd type resins, amino resins, xylene resins, toluene resins, vinyl chloride type resins, vinyl acetate type resins, polystyrenic resins, vinyl butyral type resins, acrylic resins, diallyl phthalate type resins, epoxy type resins, urethanic resins, polyester type resins, furan type resins, silicone type resins and the like. A photo-curable type resin or electron beam-curable type resin may also be used as the resin to be contained in the composition for coating, and examples thereof include polyvinyl cinnamic acid ester type resins, polyvinyl benzalacetophenone type resins, polyvinyl styrylpyridine type rsins, polyvinyl anthral type resins, unsaturated polyester type resins, acrylated oil, acrylated alkyd type resins, acrylated polyester type resins, acrylated polyether type resins, acrylated epoxy type resins, acrylated polyurethane type resins, acrylic resins, acrylated spirane type resins, acrylated silicone type resins, acrylated fluorine type resins, and macromers, oligomers and monomers of cation polymerization type epoxy type resins, and the like. These resins to be contained in the composition for coating may be used alone or as a mixture of two or more of them in a range such that transparency is not spoiled. As such resins, those having a refractive index after curing of 1.45 to 1.60 are preferred in the point that cured coats having an excellent transparency can be obtained, and among them photocurable type or electron beam-curable type acrylic resins, and photocurable type or electron beam-curable type acrylic-denatured resins, each having a refractive index after curing of 1.48 to 1.55, are particularly preferred.

Additives, a solvent and the like may, if necessary, be added into the resin composition for laser-marking of the invention in a range such that transparency of the composition is not spoiled. As the additives, there may be used those usually used in molding materials or compositions for coating in usually-added amounts. Examples of the additives include a curing agent (such as an amine type curing agent, acid anhydride type curing agent or peroxide type curing agent, a desiccant (such as cobalt naphthenate or calcium naphthenate), a crosslinking agent, a photo-initiator (such as the acetophenone type, benzophenone type, Michler's ketone type, benzyl type, benzoin type or thioxanthone type), a photo-sensitizer (such as the butylamine type, triethylamine or diethylaminoethyl methacrylate), a polymerization inhibitor (such as hydroquinone, benzoquinone or sodium carbamate type compound), a dispersant (such as a metallic soap on surface active agent), a flowability controller (such as a metallic soap, bentonite, a polymerized oil, sodium alginate, casein, aerosil, or an organix type or inorganic type fine particle), a precipitation inhibitor- (such as lacithin), a flame retardant (such as antimony trioxide, a phosphate ester, or a chlorine or bromine type flame retardant), a lubricant or mold releasing agent (such as a paraffinic wax, polyethylenic wax, montain wax, fatty acid, fatty acid amide, fatty acid ester, aliphatic alcohol, partial ester of fatty acid and polyhydric alcohol, surface active agent, silicone type compound or fluorine type compound), a plasticizer (such as a phthalic acid derivative, adipic acid derivative, sebacic acid derivative, trimellitic acid derivative, epoxy derivative, fatty acid derivative or organic phosphoric acid derivative), a stabilizer (such as a metallic soap, organotin type or phosphite ester type compound), an antioxidant (such as a naphthylamine type, diphenylamine type, quinoline type, phenol type or phosphite ester type compound), an ultraviolet absorber (such as a salicylic acid derivative, benzophenone type, benzotriazole type or hindered amine type compounds), etc.

In order to obtain the resin composition for laser-marking of the invention containing the above various components, it is sufficient, for example, to uniformly mix or knead these components in an optional manner.

The method for laser-marking of the invention can be carried out by forming the surface of the marking-intended area with the resin composition using a method wherein ① the resin composition for laser-marking of the invention is used as all or a part of the organic material part of the object, ② the surface of the object is covered with the resin composition, ③ printing, coating or multilayer molding is made on a part of the surface of the object using the resin composition, or ④ a type made of the resin composition is stuck onto the surface of the object, or the like; and then irradiating the surface with laser beams. It is possible to provide a highly sensitive and highly visible white marking merely by application of laser beams. Among the above processes, the above process ② is preferred from the reason that when a photocurable or electron beam-curable composition for coating is used as the resin composition, laser-marking is effectively carried out due to no need of use of a solvent and heating.

Although the laser used for the laser-marking method of the invention is not specifically limited, a laser which emits laser beams having their wavelength in the far infrared region is preferred thereamong. There may usually be used as such lasers carbon dioxide leasers, carbon monoxide lasers, semiconductor lasers and the like, each emitting laser beams having a wavelength of 5 to 15 micrometers, preferably 8 to 12 micrometers. Among them are particularly preferred carbon dioxide lasers emitting laser beams having a wavelength of 10.6 micrometers, for example, a Transversely Excited Atmospheric Pressure (TEA) type carbon dioxide laser and a scanning type (continuously oscillating or pulse oscillating) carbon dioxide laser. As the device, there may be used, for instance, a device which has an output of 0.5 to 20 Joule/pulse and is capable of applying laser beams 1 to 200 times/sec. in a pulse duration time of 0.1 to 10 microseconds in respect of the TEA type carbon dioxide laser, and a device which has an output of 0.5 to 2000 W and has a pulse interval of 2 to 10 kHz in case of pulse oscillation in respect of the scanning type (continuously oscillating or pulse oscillating) carbon dioxide laser, or the like.

As the method for applying laser beams there may be adopted for example, a method of making laser beams as a spot of a suitable size scan the surface of the object, a method of cutting rectangular laser beams as is obtained in the TEA type carbon dioxide laser through a mask to a desired mark shape and applying the resultant laser beams onto the surface of the object, or the like.

Examples of the object to be marked using the laser-marking method of the invention include electronic parts such as condensors, chip resistors, inducers and IC; electric parts such as connections, cases and print circuit boards; products which are usually marked such as electric wires, key tops, sheets, machine parts, housings for electric products, notes and cards; articles too small to mark by transferring; articles for which it is necessary to make a very small and precise marking (for example, bar cords); and the like.

The present invention is further specifically described by the following examples and compositive examples. In this connection, please note that part appearing throughout these examples is part by weight in all instances.

EXAMPLES 1 TO 6 AND COMPARATIVE EXAMPLE 1 TO 3

| | |
|---|---|
| Polyethylene glycol diacrylate (molecular weight 600, a reaction product of polyethylene glycol and acrylic acid) | 64.5 parts |
| Photopolymerization initiator (α-hydroxyisobutylphenone) | 3.2 parts |
| The inorganic compound indicated in Table 1 | 32.3 parts |

The above components are uniformly mixed in a laboratory mixer to prepare a composition for coating. The composition was applied onto a glass plate with a bar coater to a thickness of 50 micrometers, and the resulting coat was cured with application of ultraviolet rays of 600 m Joule/cm² from a high pressure mercury lamp to obtain a specimen which is transparent to white color-turbid. Then, this specimen was irradiated with 1 pulse of laser beams whose irradiation energy is 4 Joule/cm² through a predetermined mask using a TEA carbon dioxide laser (wavelength about 10.6 micrometers) to carry out a white marking.

The resulting specimen was evaluated for the coloring property of laser beams-irradiated area, the transparency of laser beams-nonirradiated area and the visibility of the marking by visual observation according to the following standard. The results were obtained that the specimens having excellent coloring property and transparency also have a good visibility, but the speciments having an inferior transparency has an inferior visibility even if they have an excellent coloring property. The results are indicated in Table-1.

TABLE 1

| | Inorganic compound | Coloring property | Transparency | Visibility |
|---|---|---|---|---|
| Example | | | | |
| 1 | Anhydrous calcium borate | ⊚ | ⊚ | ⊚ |
| 2 | Anhydrous lithium borate | ⊚ | ⊚ | ⊚ |
| 3 | Anhydrous aluminum borate | ○ | ⊚ | ○ |
| 4 | Anhydrous zinc borate | ○ | ○ | ○ |
| 5 | Anhydrous aluminum phosphate | ○ | ⊚ | ○ |
| 6 | Phosphoric acid-containing glass powder*[1] | ⊚ | ⊚ | ⊚ |
| Comparative Example | | | | |
| 1 | Hydrous zinc borate | ⊚ | X | Δ |
| 2 | Hydrous zinc phosphate | ⊚ | X | Δ |
| 3 | Hydrous calcium phosphate | Δ | X | X |
| 4 | Aluminum hydroxide | X | Δ | X |

*[1] The composition of the phosphoric acid-containing glass powder is $Al_2O_3/B_2O_3/Li_2O/Na_2O/P_2O_5 = 25/10/5/20/40$
⊚: Particularly good
○: good
Δ: somewhat bad
X: bad

EXAMPLES 7 TO 9

| | |
|---|---|
| Neopentyl glycol diacrylate | 72 parts |
| Photopolymerization initiator (α-hydroxyisobutylphenone) | 4 parts |
| The inorganic compound indicated in Table 2 | 20 parts |

The procedure of Example 1 was repeated except for using the above components to prepare a composition for coating, and then the same procedure with Example 1 was continued to obtain a specimen on which a white marking was made. The specimen was evaluated for coloring property, transparency and visibility. The results are shown in Table-2.

EXAMPLE 10

| | |
|---|---|
| The acrylated polyester resin wherein the both sides of the polyester resin composed of phthalic anhydride and diethylene glycol were acrylated | 55 parts |
| Photo-initiator (α-hydroxyisobutylphenone) | 3 parts |
| Basic magnesium carbonate | 42 parts |

The above components except the photo-initiator were adequately kneaded by a three roll-mill, the photo-initiator was added, and the mixture was uniformly mixed in a laboratory mixer to prepare a composition for coating. Then, the procedure of Example 1 was repeated except for using laser beams whose irradiation energy amount is 6 Joule/cm² to obtain a specimen on which a white marking was made. The specimen was evaluated for coloring property, transparency and visibility. The results are shown in Table-2.

EXAMPLE 11

| | |
|---|---|
| Acrylate urethane | 48 parts |
| Hydroxypropyl acrylate | 32 parts |
| Photo-initiator | 4 parts |
| (α-hydroxyisobutylphenone) | |
| Anhydrous calcium borate | 16 parts |

The procedure of Example 10 was repeated except for using the above components to prepare a composition for coating. Then, the same procedure with Example 10 was further continued except that laser beams whose irradiation energy amount is 9 Joule/cm² was used to obtain a specimen on which a white marking was made. The specimen was evaluated for coloring property, transparency and visibility. The results are shown in Table-2.

TABLE 2

| Example | Inorganic compound | Coloring property | Transparency | Visibility |
|---|---|---|---|---|
| 7 | Anhydrous calcium borate | ◉ | ◉ | ◉ |
| 8 | Phosphoric acid-containing glass powder | ◉ | ◉ | ◉ |
| 9 | Basic magnesium carbonate | ◉ | ◉ | ◉ |
| 10 | Basic magnesium carbonate | ◉ | ◉ | ◉ |
| 11 | Anhydrous calcium borate | ◉ | ◉ | ◉ |

EXAMPLE 12

| | |
|---|---|
| Bisphenol F diglycidyl ether | 36 parts |
| (Epoxy resin, epoxy equivalent 180) | |
| Acid anhydride type curing agent | 31 parts |
| (Acid anhydride equivalent 166) | |
| Curing accelerator | 0.7 part |
| (benzyl dimethyl amine) | |
| Basic magnesium carbonate | 22 parts |

The above components were uniformly mixed by a three roll-mill to prepare a molding material, and the material was cast to a thickness of 5 mm between two glass plates, and cured under the heating condition of 5 hours at 80° C. and then 5 hours at 160° C. to obtain a colorless specimen excellent in transparency. The specimen was then irradiated with laser beams in the same manner as in Example 1 to make a white marking, and then evaluated for coloring property, transparency and visibility. The results are shown in Table-3.

EXAMPLE 13

| | |
|---|---|
| Ethylene glycol diglycidyl ether | 27 parts |
| (Epoxy resin, epoxy equivalent = 135) | |
| Acid anhydride type curing agent | 31 parts |
| (Acid anhydride equivalent = 166) | |
| Curing accelerator | 0.7 part |
| (Benzyldimethylamine) | |
| Phosphoric acid-containing glass powder | 20 parts |

The procedure of Example 12 was repeated except for using the above components to prepare a molding material. The same procedure with Example 12 was further continued to obtain a specimen on which a white marking was made. The specimen was evaluated for coloring property, transparency and visibility. The results are shown in Table-3.

EXAMPLE 14

| | |
|---|---|
| Ethylene glycol diglycidyl ether | 27 parts |
| (Epoxy resin, epoxy equivalent = 135) | |
| Acid anhydride type curing agent | 31 parts |
| (Acid anhydride equivalent = 166) | |
| Curing accelerator | 0.7 part |
| (Benzyldimethylamine) | |
| Basic zinc carbonate | 10.4 parts |

The procedure of Example 12 was repeated except for using the above components to prepare a molding material. Then, the same procedure with Example 12 was further continued to obtain a specimen on which a white marking was made. The specimen was evaluated for coloring property, transparency and visibility. The results are shown in Table-3.

EXAMPLE 15

| | |
|---|---|
| Polystyrene | 80 parts |
| (Melt index = 25 g/10 min) | |
| Basic magnesium carbonate | 20 parts |

The above components were throughly kneaded at 200° C. for 10 minutes using a laboratory mixer, cooled and pulverized to prepare a molding material. The molding material was subjected to injection molding at 200° C. to obtain a rectangular and transparent specimen 0.8 mm thick. A white marking was made on the specimen in the same manner as in Example 1, and the specimen was than evaluated for coloring property, transparency and visibility. The results are shown in Table-3.

EXAMPLE 16

| | |
|---|---|
| Acrylic resin | 30 parts |
| (Butyl methacrylate/Methyl methacrylate = 60/40) | |
| Toluene | 60 parts |
| Butylcellosolve | 10 parts |
| Anhydrous lithium borate | 10 parts |

The above components were mixed for about two hours with a paint conditioner to prepare a composition for coating, and the composition was applied onto a glass plate to a thickness of 30 micrometers with an applicator and dried at room temperature to obtain a colorless and transparent speciment. Then, the specimen was marked white in the same manner as in Example 1, and then evaluated for coloring property, transparency and visibility. The results are shown in Table-3.

TABLE 3

| Example | Inorganic compound | Coloring property | Transparency | Visibility |
|---|---|---|---|---|
| 12 | Basic magnesium carbonate | ◉ | ◉ | ◉ |
| 13 | Phosphoric acid-containing glass powder | ◉ | ◉ | ◉ |
| 14 | Basic zinc carbonate | ◉ | ◉ | ◉ |

TABLE 3-continued

|    | Inorganic compound          | Coloring property | Trans- parency | Visi- bility |
|----|-----------------------------|-------------------|----------------|--------------|
| 15 | Basic magnesium carbonate   | ⊚                 | ⊚              | ⊚            |
| 16 | Anhydrous lithium borate    | ⊚                 | ⊚              | ⊚            |

We claim:

1. A method for laser-marking which comprises marking the surface of an object composed of a resin composition containing at least one inorganic compound selected from the group consisting of an anhydrous metal borate salt, an anhydrous metal phosphate salt, a phosphoric acid-containing glass, basic zinc carbonate and basic magnesium carbonate, and a resin by applying laser beams onto the surface.

2. The method of claim 1 wherein the inorganic compound is at least one inorganic compound selected from the group consisting of anhydrous zinc borate, anhydrous aluminum borate, anhydrous lithium borate, anhydrous calcium borate, anhydrous aluminum phosphate, a phosphoric acid-containing glass, basic zinc carbonate and basic magnesium carbonate.

3. The method of claim 1 wherein the inorganic compound is at least one inorganic compound selected from the group consisting of anhydrous lithium borate, anhydrous calcium borate, a phosphoric acid-containing glass and basic magnesium carbonate.

4. The method of claim 3 wherein the object composed of the resin composition is the photocured or electron beam-cured coat of a coating composition containing a photocurable or electron beam-curable acrylic or acrylic-denatured resin having a refractive index after hardening of 1.48 to 1.55.

5. The method of claim 2 or 3 wherein the object composed of the resin composition is a cured coating containing a resin having a refractive index after curing of 1.45 to 1.60.

6. The method of claim 1, 2 or 3 wherein the object composed of the resin composition is a cured coating.

7. A resin composition for laser-marking which comprises at least one inorganic compound selected from the group consisting of an anhydrous metal borate salt, an anhydrous metal phosphate salt, a phosphoric acid-containing glass, basic zinc carbonate and basic magnesium carbonate, and a resin.

8. The resin composition of claim 7 wherein the inorganic compound is an at least one inorganic compound selected from the group consisting of anhydrous zinc borate, anhydrous aluminum borate, anhydrous lithium borate, anhydrous calcium borate, anhydrous aluminum phosphate, a phosphoric acid-containing glass, basic zinc carbonate and basic magnesium carbonate.

9. The resin composition of claim 7 wherein the inorganic compound is at least one inorganic compound selected from the group consisting of anhydrous lithium borate, anhydrous calcium borate, a phosphoric acid-containing glass and basic magnesium carbonate.

10. The resin composition of claim 9 which is a composition for coating containing a photocurable or electron beam-curable acrylic or acryl-denatured resin having a refractive index after curing of 1.48 to 1.55.

11. The resin composition of claim 8 or 9 which is a composition for coating containing a resin having a refractive index after curing of 1.45 to 1.60.

12. The resin composition of claim 7, 8 or 9 which is a composition for coating.

* * * * *